United States Patent
Xuan et al.

(10) Patent No.: US 7,989,818 B2
(45) Date of Patent: Aug. 2, 2011

(54) LIGHT EMITTING DEVICE WITH MAGNETIC FIELD

(75) Inventors: Rong Xuan, Taipei County (TW); Chih-Hao Hsu, Hsinchu (TW); Jenq-Dar Tsay, Kaohsiung (TW); Mu-Tao Chu, Hsinchu (TW)

(73) Assignee: Industrial Technology Research Institute, Hsinchu (TW)

( * ) Notice: Subject to any disclaimer, the term of this patent is extended or adjusted under 35 U.S.C. 154(b) by 414 days.

(21) Appl. No.: 12/146,422

(22) Filed: Jun. 25, 2008

(65) Prior Publication Data

US 2009/0179214 A1    Jul. 16, 2009

Related U.S. Application Data

(63) Continuation of application No. 12/117,747, filed on May 9, 2008, now Pat. No. 7,906,786.

(60) Provisional application No. 61/020,397, filed on Jan. 11, 2008.

(51) Int. Cl.
*H01L 27/15* (2006.01)

(52) U.S. Cl. ............ 257/79; 257/E33.055; 257/E23.001

(58) Field of Classification Search ................... 257/98, 257/99, 100, 79, E33.001, 421, E33.055, 257/E23.001
See application file for complete search history.

(56) References Cited

U.S. PATENT DOCUMENTS

| 4,450,460 | A | | 5/1984 | Morimoto | |
|---|---|---|---|---|---|
| 5,874,749 | A | * | 2/1999 | Jonker | 257/98 |
| 6,858,866 | B2 | * | 2/2005 | Chen | 257/44 |
| 2005/0018725 | A1 | * | 1/2005 | Nurmikko | 372/37 |
| 2006/0186432 | A1 | * | 8/2006 | Osipov et al. | 257/103 |

OTHER PUBLICATIONS

Article titled "Two-Dimensional Quantum-Mechanical Confinement of Electrons in LED by Strong Magnetic Fields" authored by Arakawa et al., IEEE Transactions on Electron Devices, vol. ED-30, No. 4, Apr. 1983, pp. 330-334.

* cited by examiner

*Primary Examiner* — Thomas L Dickey
*Assistant Examiner* — Nikolay Yushin
(74) *Attorney, Agent, or Firm* — Jianq Chyun IP Office (57) ABSTRACT

A light emitting device with magnetic field includes a light-emitting structure and a first magnetic-source layer. The light-emitting structure includes a first doped structural layer, a second doped structural layer, an active layer between the two doped structural layers, a first electrode, and a second electrode. The first magnetic-source layer is integrated with the light-emitting structure to produce a magnetic field in the light-emitting structure. The magnetic field transversely shifts a driving current of the light-emitting structure to redistribute in the light-emitting structure.

24 Claims, 14 Drawing Sheets

LIGHT EMITTING DEVICE WITH MAGNETIC FIELD

CROSS-REFERENCE TO RELATED APPLICATION

This application is a continuation application of Ser. No. 12/117,747, filed on May 9, 2008, which claims the priority benefit of U.S. Provisional application Ser. No. 61/020,397, filed on Jan. 11, 2008. The entirety of each of the above-mentioned patent applications is hereby incorporated by reference herein and made a part of this specification.

BACKGROUND OF THE INVENTION

1. Field of Invention

The present invention relates to light emitting device. More particularly, the present invention relates to a light emitting device with magnetic field.

2. Description of Related Art

Light emitting device, such as a light emitting diode (LED) can emit light due to the driving of electron current through the active layer of the light emitting diode. However, if current density is not uniformly distributed to the whole light emitting area, the light uniformity is reduced. Even further, the non-transparent top electrode, in conventional design, is usually positioned at the center region of the light emitting area. In this manner, the current density under the top electrode is larger than the other region and can emit more light. However, the emitted light under the top electrode is blocked since the top electrode is not transparent to the light. The top electrode of the conventional LED blocks the emitted light at the central region with the highest intensity, resulting in reduction of the output light.

How to improve the light output efficiency of the LED still need further development in the field of the art.

SUMMARY OF THE INVENTION

The invention provides a light emitting device with magnetic field, which uses the mechanism to Hall Effect to arrange the position of the electrode, so as to at least improve light outputting efficiency.

The present invention in one embodiment provides a light emitting device with magnetic field, which includes a light-emitting structure and a first magnetic-source layer. The light-emitting structure includes a first doped structural layer, a second doped structural layer, an active layer between the two doped structural layers, a first electrode, and a second electrode. The first magnetic-source layer is integrated with the light-emitting structure to produce a magnetic field in the light-emitting structure.

The present invention in one embodiment provides a light emitting device with magnetic field, which includes a light-emitting structure, a transparent magnetic-source layer, a first electrode, and a second electrode. The light-emitting structure includes a first doped structural layer, a second doped structural layer, and an active layer between the two doped structural layers. The transparent magnetic-source layer is disposed on the first structural layer. The first electrode is disposed on the transparent magnetic-source layer. The second electrode is disposed on the second doped structural layer, at an opposite side to the first electrode.

According to the embodiments of the present invention, the magnetic-source layer is integrated into the structure of the light emitting device. In other words, the magnetic field is separately self-supplied in a single light emitting device. The single light emitting device can also be easily packaged into a chip.

It is to be understood that both the foregoing general description and the following detailed description are exemplary, and are intended to provide further explanation of the invention as claimed.

BRIEF DESCRIPTION OF THE DRAWINGS

The accompanying drawings are included to provide a further understanding of the invention, and are incorporated in and constitute a part of this specification. The drawings illustrate embodiments of the invention and, together with the description, serve to explain the principles of the invention.

DESCRIPTION OF THE PREFERRED EMBODIMENTS

The present invention proposes a light emitting device, in which a magnetic-source layer is integrated to improve the light outputting efficiency. Several embodiments are provided for describing the present invention. However, the present invention is not just limited to the embodiments. Further, the embodiments to each other can also be properly combined to have other embodiments.

In physical phenomenon, the Hall effect is well known that when a current flow through a conductive line and an external magnetic field is applied transversely, then the path of the current, such as the electron current, is also transversely shifted due to magnetic Lorenz force of $F=q*v*B$. The present invention involves the consideration of the Hall effect and implements the Hall effect into the LED.

Figure 1:
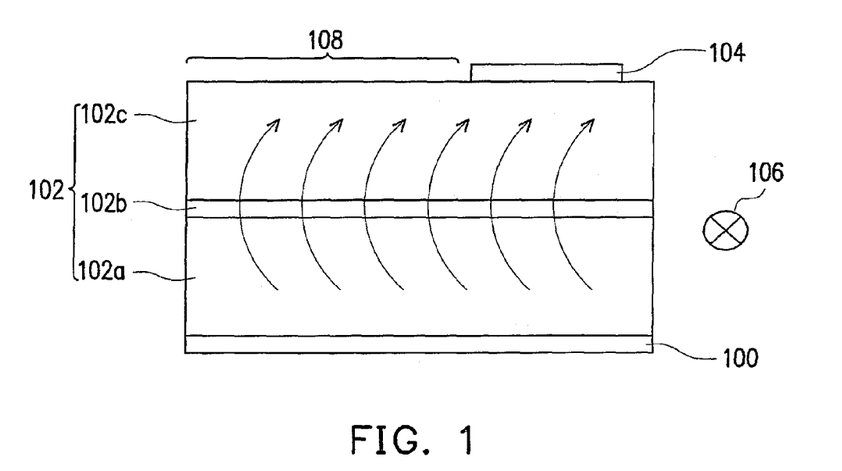
FIG. 1 is a cross-sectional view, schematically illustrating a structure of a light emitting diode with the magnetic field, according to an embodiment of the present invention.

FIG. 1 is a cross-sectional view, schematically illustrating a structure of a light emitting diode with the magnetic field, according to an embodiment of the present invention. In FIG. 1, a light emitting diode is taken as the example. The light emitting diode includes, for example, a bottom electrode 100, a light-emitting structure 102, a top electrode 104. The light-emitting structure 102 includes, for example, a first doped layer 102a, such as P-dope semiconductor layer, an active layer 102b for emitting light based on combination of electrons and electron-holes, and another doped semiconductor layer 102c, such as N-doped layer. The top electrode 104 may be not positioned at the center of the light emitting area 108.

When in operation, the current is flowing from the bottom electrode 100 to the top electrode 104. However, if an external magnetic field in a direction, such as the direction indicated by notion 106, is transversely applied, the Lorenz force is produced to shift the currents. As a result, the currents are transversely shifted to more effectively flow through the active layer 102b, but not directly move to the top electrode 104. As a result, the driving current can more effectively cause the active layer 102b to emit light.

Based on the mechanism of FIG. 1, the magnetic field is needed to be added. However, if the magnetic field is externally applied, it is not convenient in use. The present invention proposes the light emitting device, which is individually implemented with the magnetic source. As a result, each light emitting device can be separately operated without missing the magnetic field.

Figure 2:
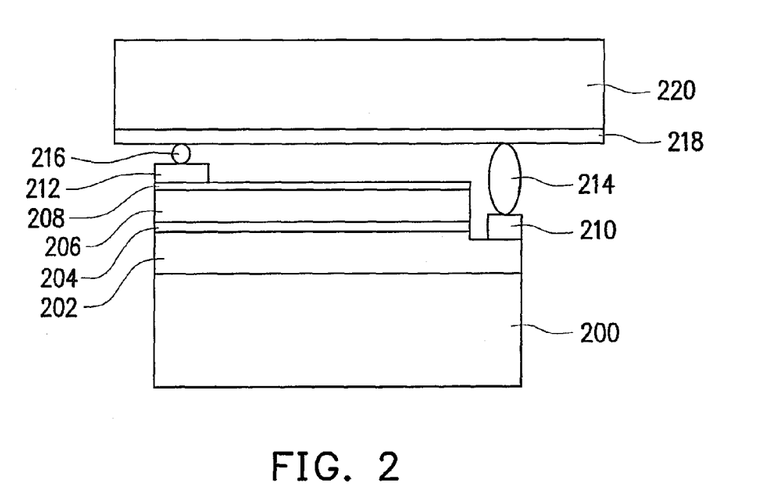
FIGS. 2-5 are cross-sectional views, schematically illustrating the structure of a light emitting device integrated with the magnetic-source layer by packaging, according to embodiments of the present invention.
Figure 3:
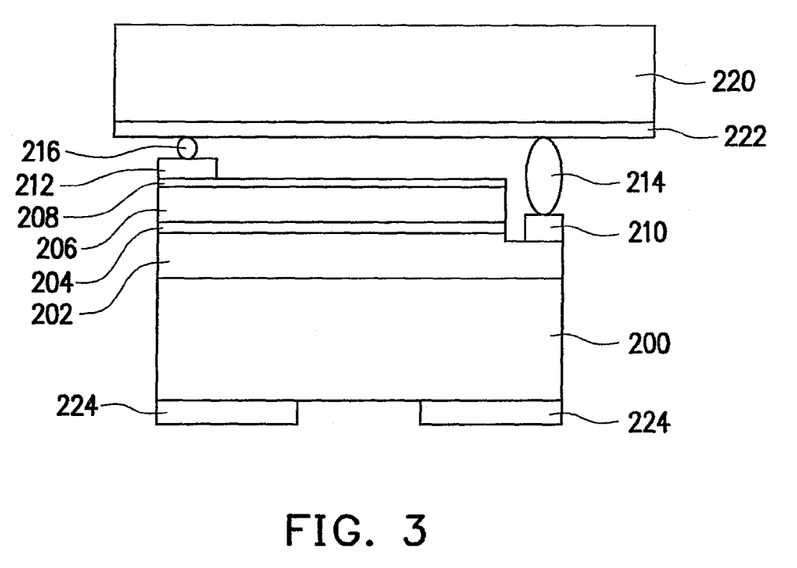
Figure 4:
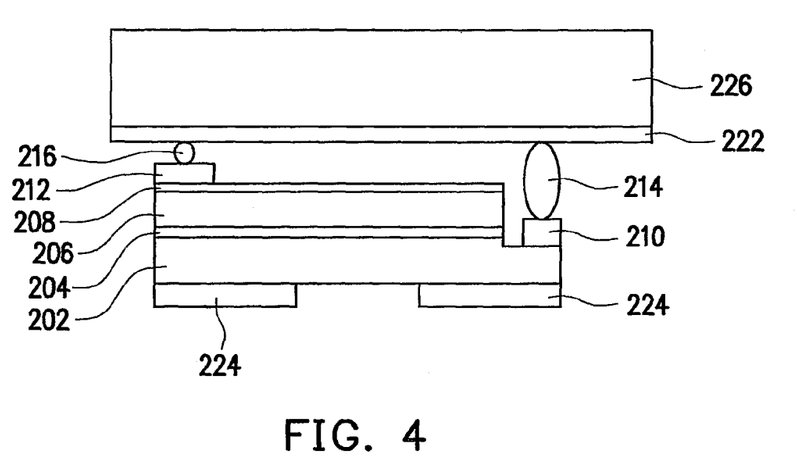

FIGS. 2-4 are cross-sectional views, schematically illustrating the structure of a light emitting device integrated with the magnetic-source layer by packaging, according to embodiments of the present invention. In FIG. 2, for example, a doped semiconductor structural layer 202 is disposed on a substrate 200. An active layer 204 is formed on the doped semiconductor structural layer 202. Another doped semiconductor structural layer 206 is formed on the active layer 204. Here, doped semiconductor structural layer can be a single layer or a stacked layer with a designed structure. However, the present invention is not to specifically limit the semiconductor structural layers. Even further, for example, a transparent conductive layer (TCL) 208 may further be formed on the semiconductor structural layer 202. The TCL 208 is in contact with the electrode 212, so as to improve the light emitting efficiency as conventionally known. Even further, depending on the light emitting direction, a mirror can also be implemented. In this example, an electrode 210 is disposed on the semiconductor structural layer 202. Another electrode 212 is disposed on the TCL layer 208. Usually, this structural part is, for example, known as an LED. The present invention is not necessary to be limited to a specific non-magnetic-field LED.

In an embodiment, in order to implement the magnetic-source, a packaging structure, such flip chip package, can be employed to integrate the magnetic-source layer in the light emitting device. The magnetic-source layer 218 can be formed on a submount 220. The magnetic-source layer 218, for example, is a ferromagnetic layer with a magnetization in a desired direction. The material to form the ferromagnetic layer includes, for example, Fe, Co, Ni, Tb . . . and so on. Further, in stead of artificial magnetic material, the natural magnet can also be used by adhering thereon. However, the direction the magnetic field should be properly arranged. The LED is then packaged onto the submount 220 with the magnetic-source layer 218 by the bonding structure 214 and 216, such as the bonding bumps or directly bonding (i.e. see FIG. 5). As a result, the magnetic-source layer 218 can produce the magnet field into the LED. In one example, if the magnetization direction of the magnetic-source layer 218 is coming out the drawing sheet then a magnetic field in the direction of 106 in FIG. 1 can be created. The LED with the submount 220 having the magnetic-source layer 218 can be separately used, in which the intended magnetic field is self-supplying in a single chip.

In FIG. 3, this embodiment is similar to the embodiment in FIG. 2 but another magnetic-source layer 224 can be further formed at the bottom surface of the substrate 200. The effect from the magnetic-source layer 224 is the same. As a result, the magnetic field in the LED can be further improved or locally adjusted.

In FIG. 4, comparing with FIG. 3, the structure can be further modified by removing the substrate 200 away while the magnetic-source layer 224 is directly formed on the doped semiconductor structural layer 202. Since the two electrodes 210 and 212 are at the same side of the LED, the doped semiconductor structural layer 202 can still be applied with the operation voltage via the electrode 210.

Figure 5:
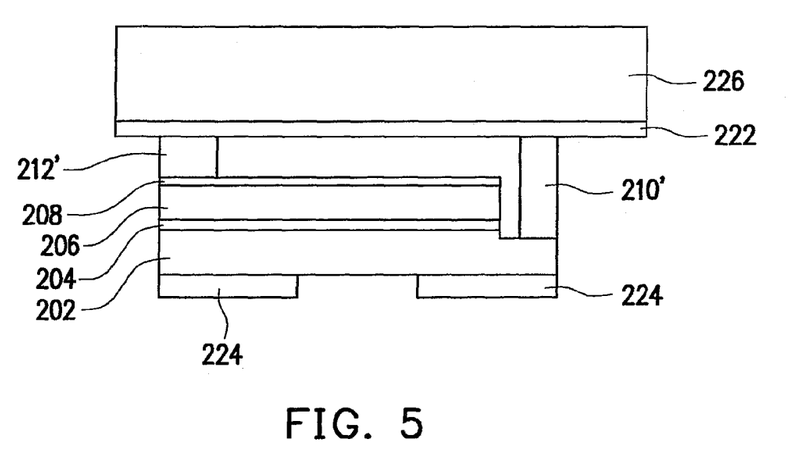

The foregoing packaging structure is, for example, based on the bonding bumps 214 and 216. However, this is not the only way to package. For example, another packaging manner can be taken as shown in FIG. 5. In FIG. 5, the electrodes 212' and 210' can be formed by for example plating so as to form an electrode pole. The electrodes 212' and 210' are then packaged to the submount 226. In other words, any proper packaging process can be used to package with submount with the magnetic-source layer.

Figure 6:
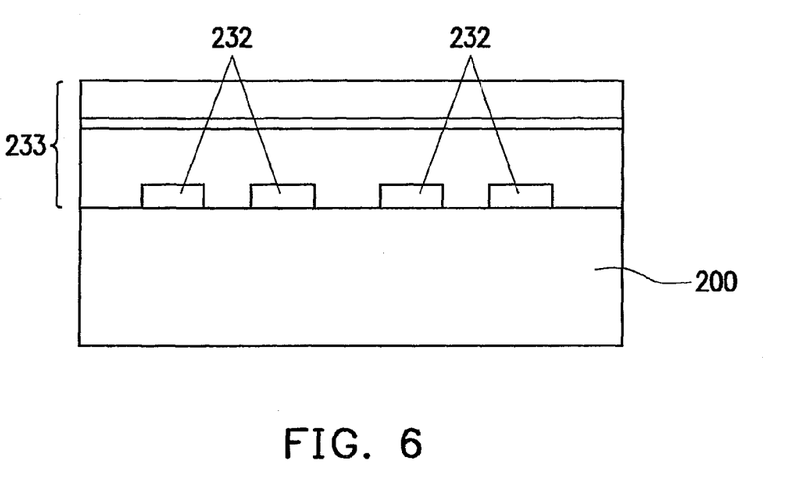
FIG. 6 is cross-sectional view, schematically illustrating the structure of a light emitting device integrated with the magnetic-source layer in strip, according to an embodiment of the present invention.

FIG. 6 is a cross-sectional view, schematically illustrating the structure of a light emitting device integrated with the magnetic-source layer in strip, according to an embodiment of the present invention. In FIG. 6, the magnetic layer 232 can be formed between the substrate 200 and the LED 233 based on the technology of Epitaxial Laterally Overgrown (ELOG). In an example, the magnetic layer 232 can be formed on the substrate 200 and patterned into the intended pattern, such as strip. Then, the lower semiconductor layer of the LED 234 can be grown by ELOG process.

Figure 7:
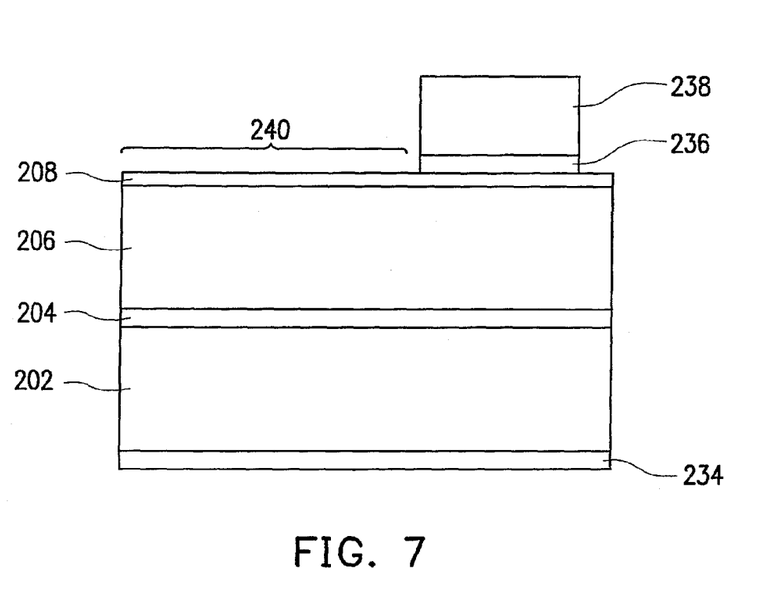
FIGS. 7-8 are cross-sectional views, schematically illustrating the structures of various light emitting devices integrated with the magnetic-source layer, according to embodiments of the present invention.
Figure 8:
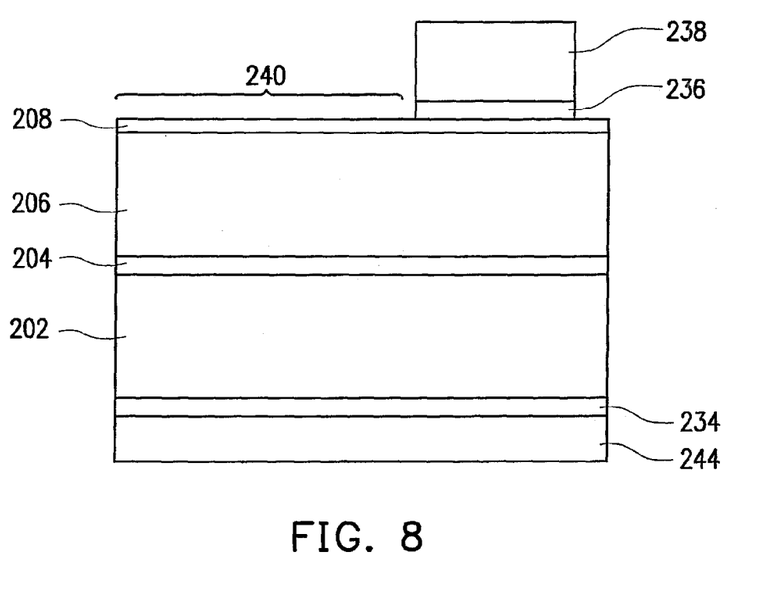

FIGS. 7-8 are cross-sectional views, schematically illustrating the structures of various light emitting devices integrated with the magnetic-source layer, according to embodiments of the present invention. Bases on the same aspect, the magnetic-source layer can be integrated with the LED as the light emitting device by various manners. The following examples are some but for all.

Figure 9:
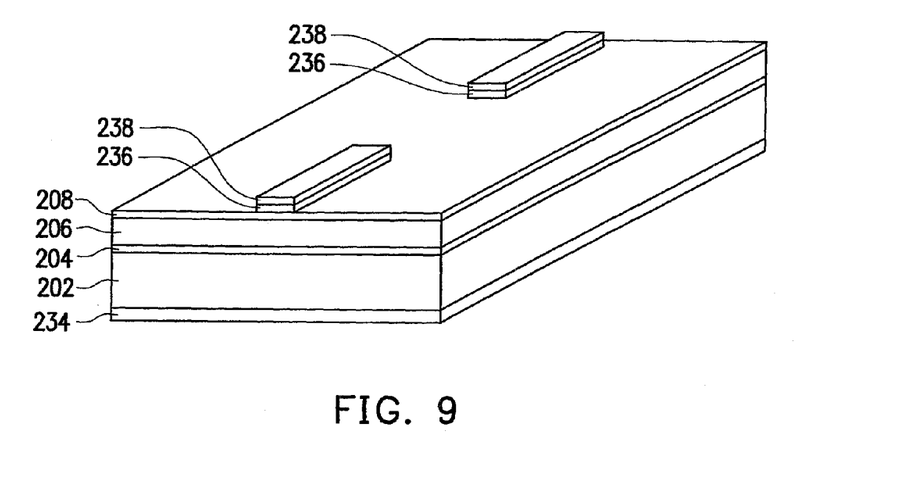
FIGS. 9-10 are perspective views, schematically illustrating the structures in FIGS. 7-8, according to embodiments of the present invention.

In FIG. 9 for alternative structure, the LED structure as described in other embodiment includes the doped semiconductor structural layer 202, the active layer 204, and another doped semiconductor structural layer 206. Further, the TCL 208 may also be included. The LED structure is also taken as the example for the following embodiments to implement the magnetic-source layer. The bottom electrode layer 234 is formed on the doped semiconductor structural layer 202 at one side and another electrode layer 236 is formed on the TCL 208 at the opposite side to the bottom electrode layer 234. A light emitting area 240 is intended to form. In this structure as the base, the magnetic-source layer 238 can be, for example, formed on the electrode layer 236, and preferably just formed on the electrode layer 236. The magnetic field in the LED with the direction 242 can also be, for example, created. In FIG. 8 for further modification, another magnetic-source layer 244 can be formed on the electrode layer 234.

Figure 10:
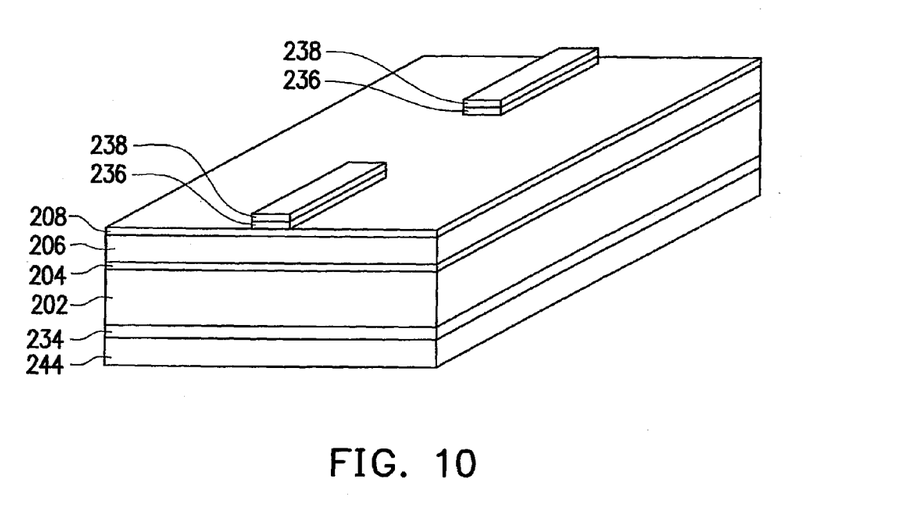

FIGS. 9-10 are perspective views, schematically illustrating the structures in FIGS. 7-8, according to embodiments of the present invention. In FIGS. 9-10, the electrode layer 236 and the magnetic-source layer 238 can be in several sections with a pattern, such as strip pattern, to produce the intended magnetic field. In other words, the top electrode with the magnetic field can be in single piece or in several pieces depending on how the magnetic field to be created for improving the light outputting efficiency.

Figure 11:
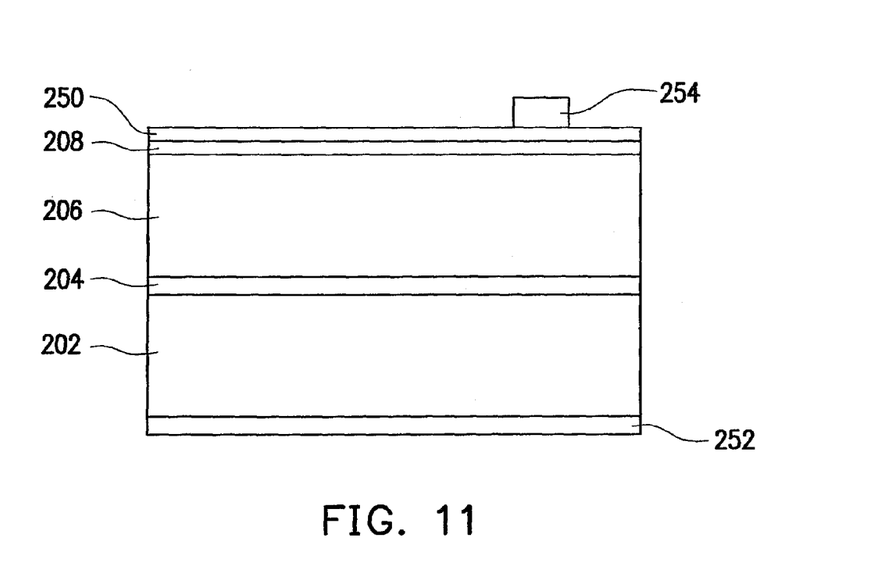
FIGS. 11-27 are cross-sectional views, schematically illustrating the structures of various light emitting devices integrated with the magnetic-source layer, according to embodiments of the present invention.
Figure 12:
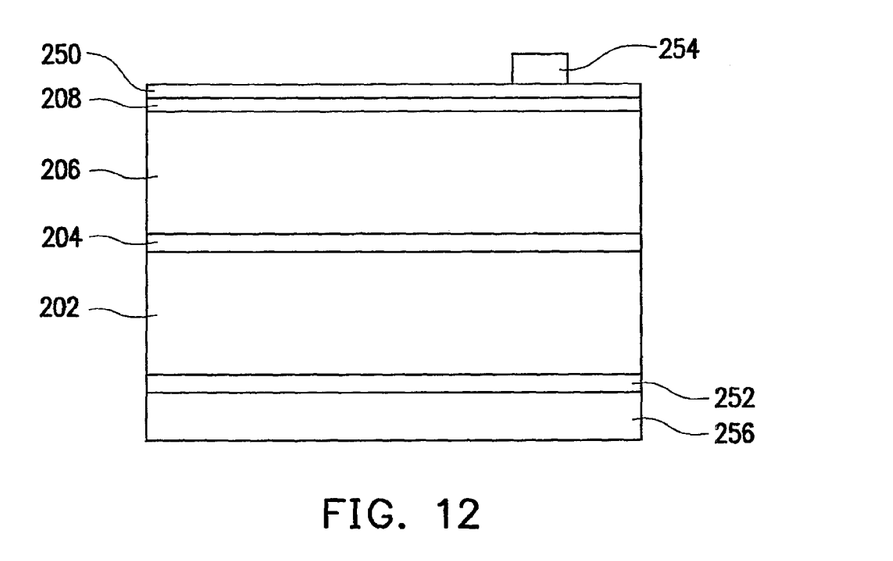

For the further modifications, the magnetic-source layer can be implemented in more alternative manners. FIGS. 11-27 are cross-sectional views, schematically illustrating the structures of various light emitting devices integrated with the magnetic-source layer, according to embodiments of the present invention. In FIG. 11, the bottom electrode layer 252 can be on the bottom surface of the doped semiconductor structural layer 202. However in this embodiment, the magnetic-source layer 250 can be between the LED and the electrode layer 254. Preferably, the magnetic-source layer 250 is between the TCL 208 and the electrode layer 254. More preferably, the magnetic-source layer 250 can further be light transparent and therefore can extend along the surface of the TCL 208. Here as can be understood in physics, the metal is usually not light transparent. However, when the thickness of the metal is sufficiently thin, it becomes transparent. Alternatively, if the light emitting direction is toward the electrode 252, then the magnetic-source layer 250 is not necessary to be light transparent. In this example, the magnetic-source layer 250 can be, for example, the ferromagnetic material in thin metal or any other condition in light transparent. This structure can more efficiently produce the transverse magnetic field. In FIG. 12, in addition to the structure in FIG. 11, another magnetic-source layer 256 can be formed at the bottom of the light emitting device, such as on the electrode layer 252. The magnetic-source layer 256 is not necessary to be transparent.

Figure 13:
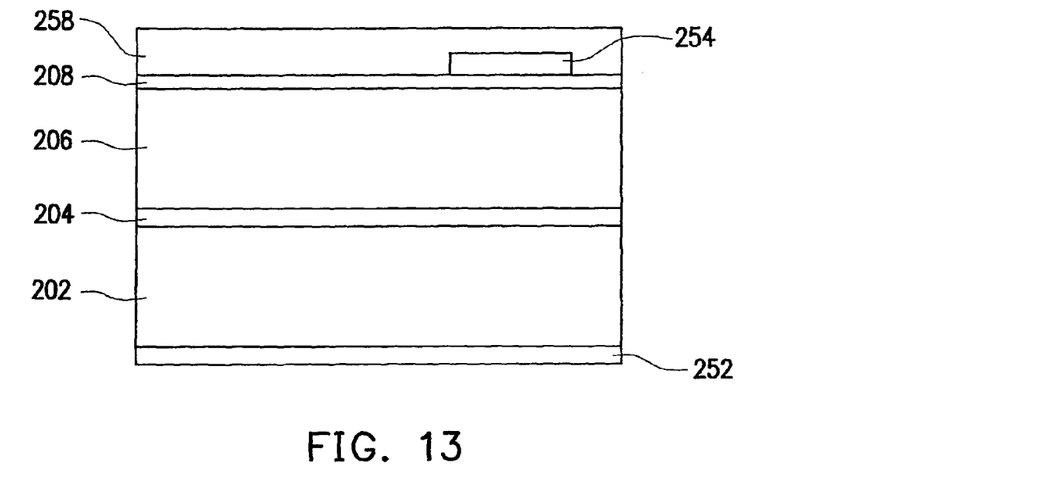
Figure 14:
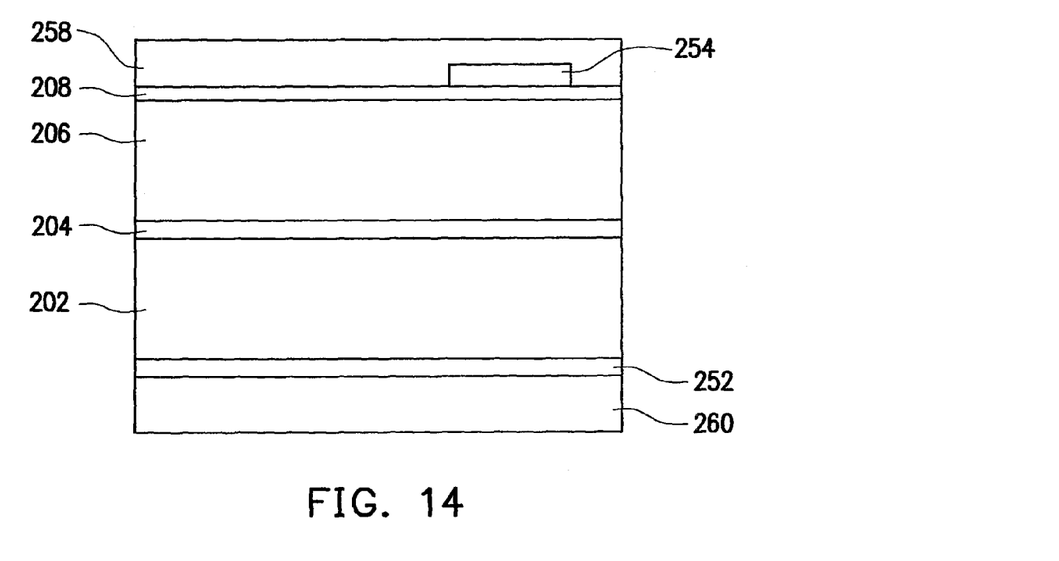
Figure 15:
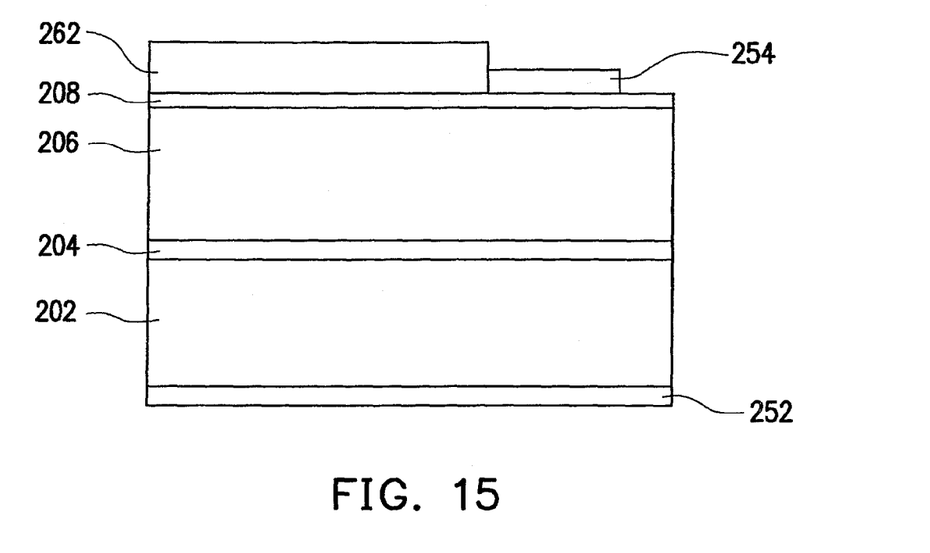

In FIG. 13, alternatively, the magnetic-source layer 258 can be at top of the light emitting device. For example, the magnetic-source layer 258 can cover over the TCL 208 and the electrode 254. Likewise, depending on the light emitting direction, the magnetic-source layer 258 can be light transparent or non-transparent. In FIG. 14, the additional magnetic-source layer 260 is further formed at bottom. The magnetic-source layer 260 can be also serving as a reflector to reflect light back.

Figure 16:
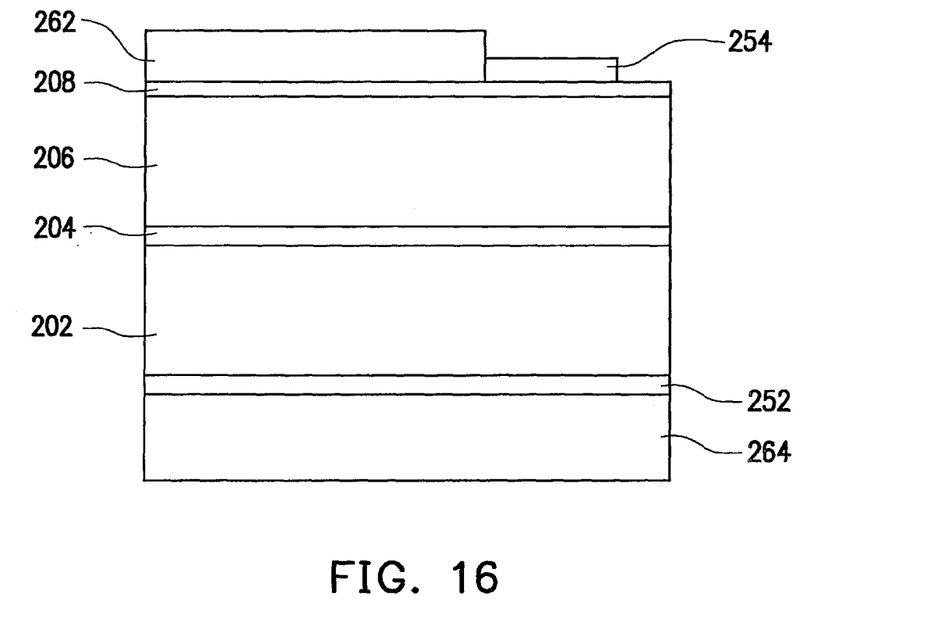

In FIG. 14, even further in comparing with FIG. 13, the magnetic-source layer 262 can be just cover a portion of the light emitting area without covering the electrode 254. In FIG. 16, the additional magnetic-source layer 264 is further formed at bottom. The magnetic-source layer 264 can be also serving as a reflector to reflect the light back.

Figure 17:
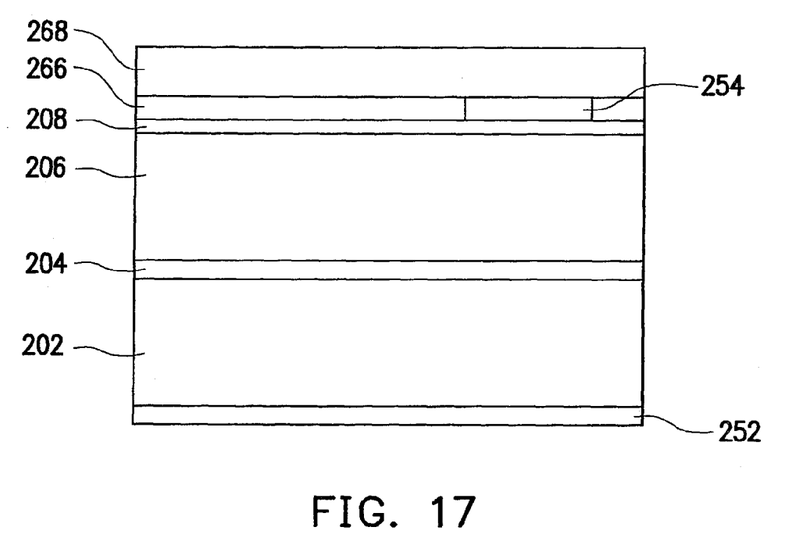
Figure 18:
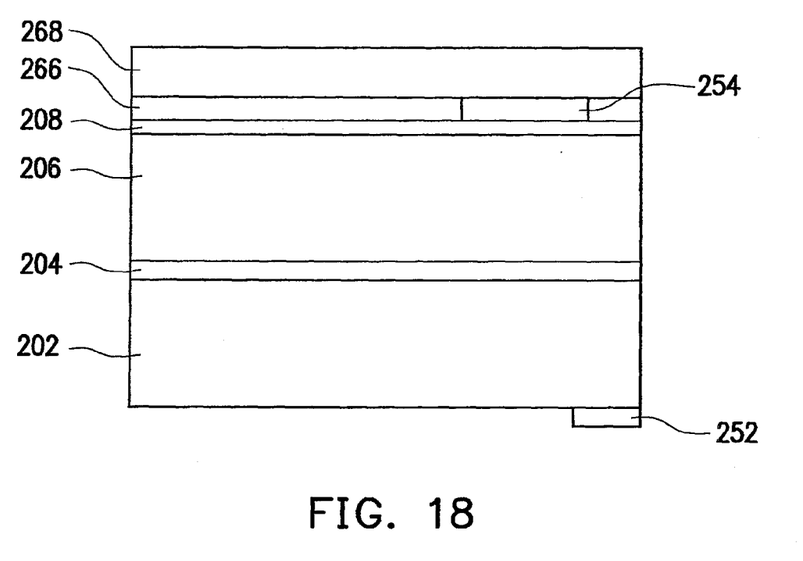

In FIG. 17, if the light emitting direction is toward the electrode 252. The electros can be also the TCL. Then, the reflecting layer 266 can be formed at the side having the electrode 254. Then, if the magnetic-source layer 268 can be formed over the reflecting layer 266 and the electrode layer 254, for example. Even further, like the other embodiment, a transparent magnetic-source layer can be on the electrode layer 252 if it is needed. Even further, the electrode 252 can be a small area as shown in FIG. 18.

Figure 19:
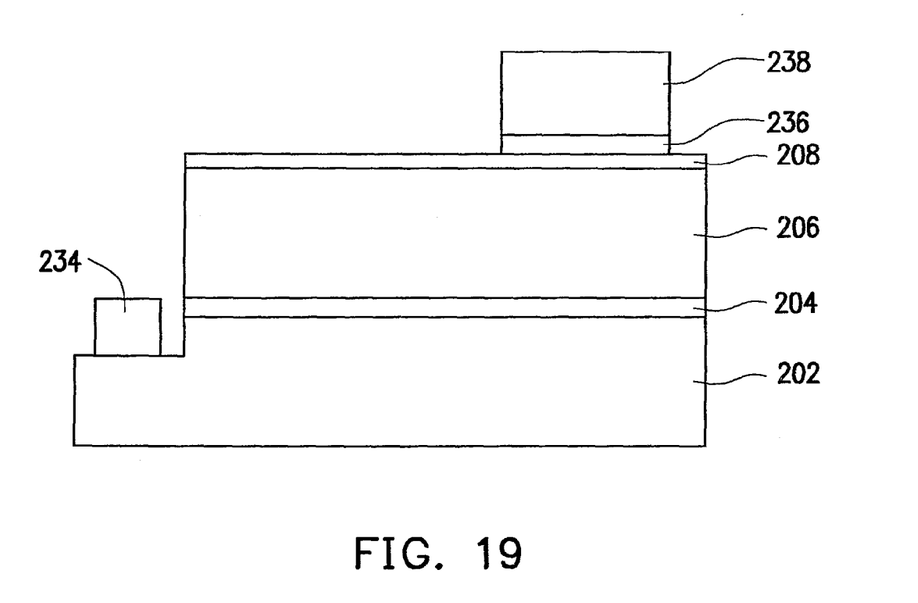
Figure 20:
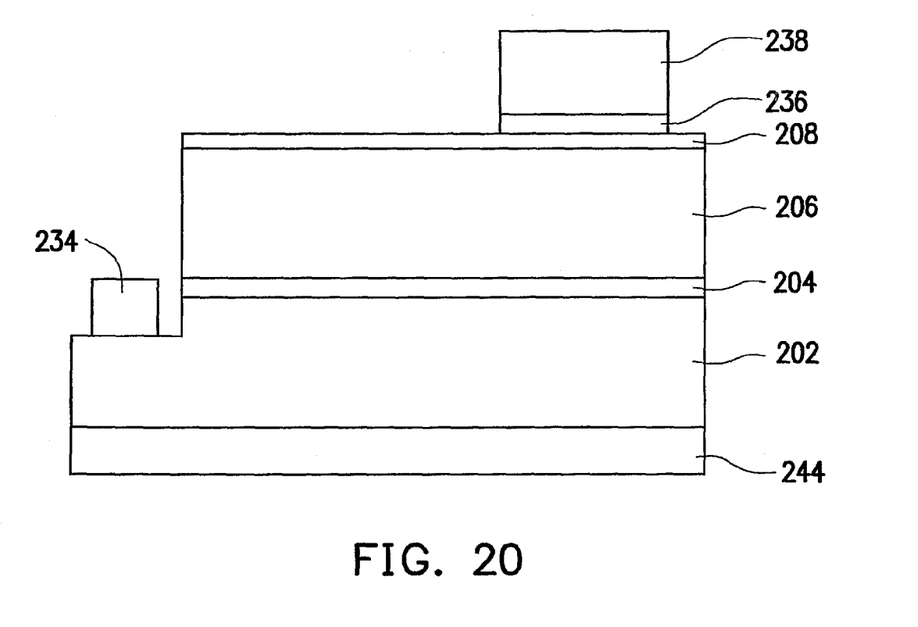

Even further, when the LED is designed by arranging the two electrodes at the same side, the magnetic-source can also be integrated. Several examples are provided. In FIG. 19, based on the structure in FIG. 7, the electrode 234 can be formed on an extending region of the doped semiconductor structural layer 202 but at the same side as the electrode 236. The magnetic-source layer 238 can also be formed on the electrode 236. In FIG. 20, it is based on the structure in FIG. 8. The electrode 234 is formed on an extending region of the doped semiconductor structural layer 202. The magnetic-source layer 244 can be directly disposed on the doped semiconductor structural layer 202.

Figure 21:
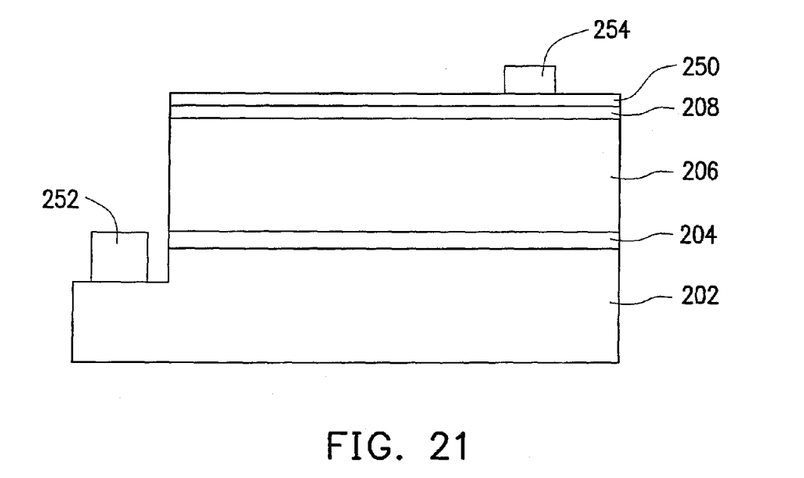
Figure 22:
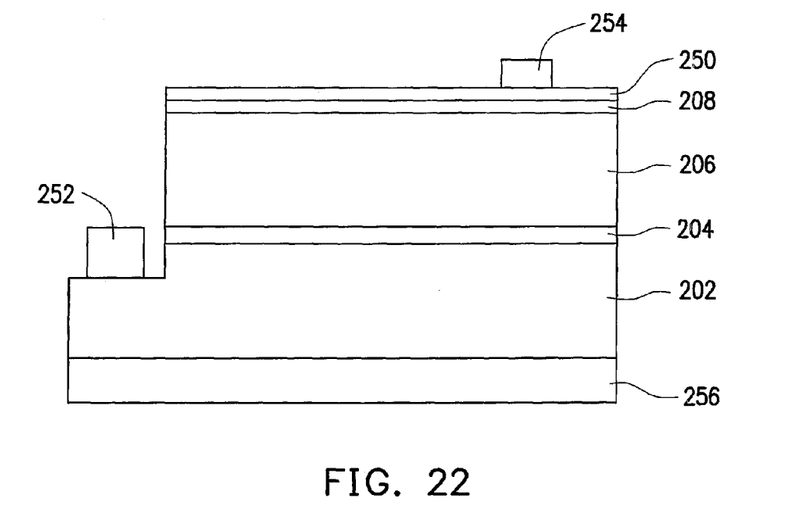
Figure 23:
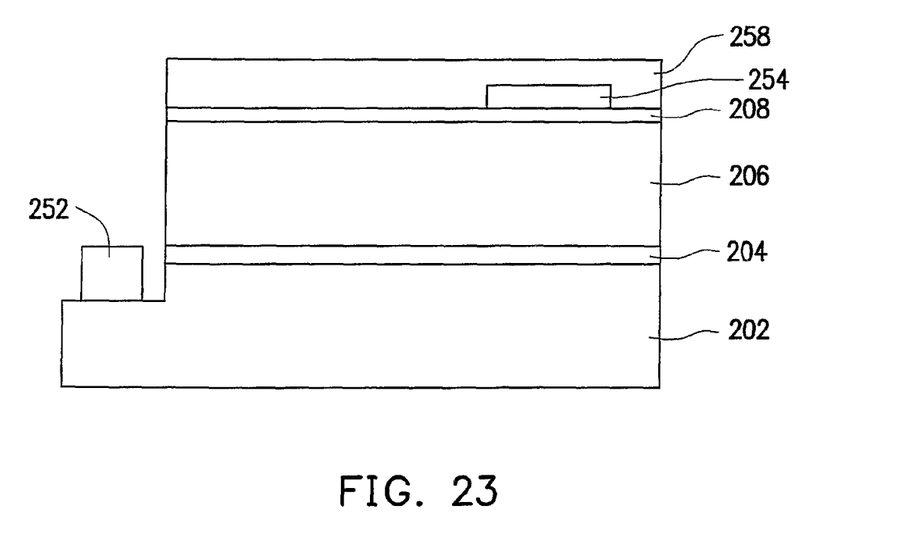
Figure 24:
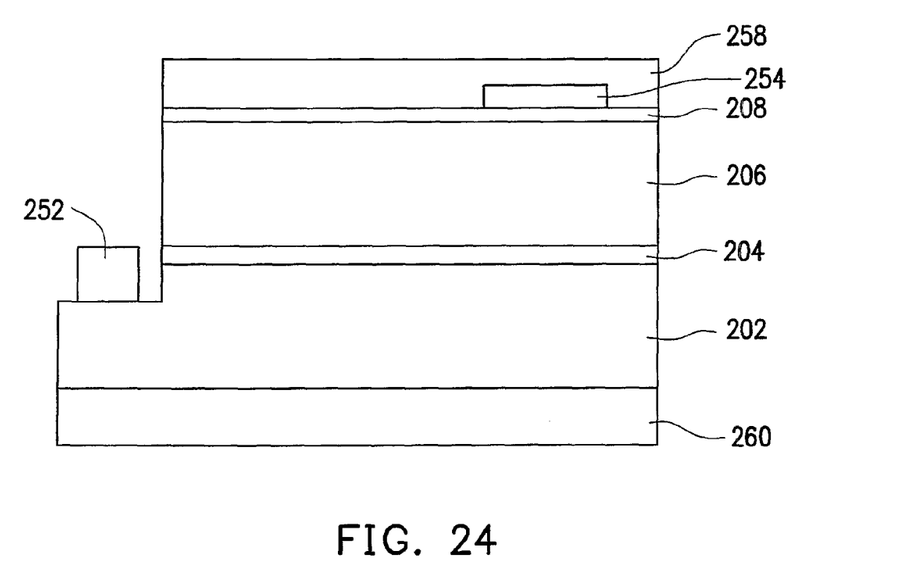
Figure 25:
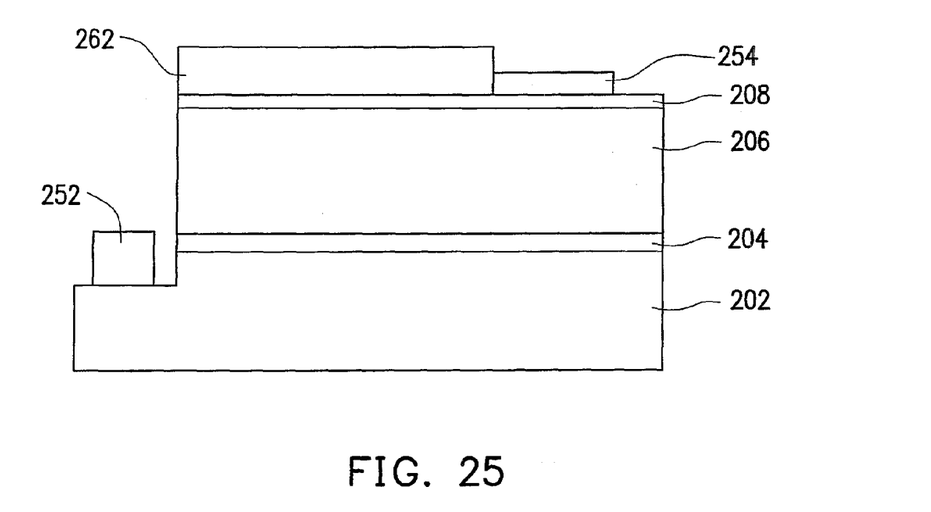
Figure 26:
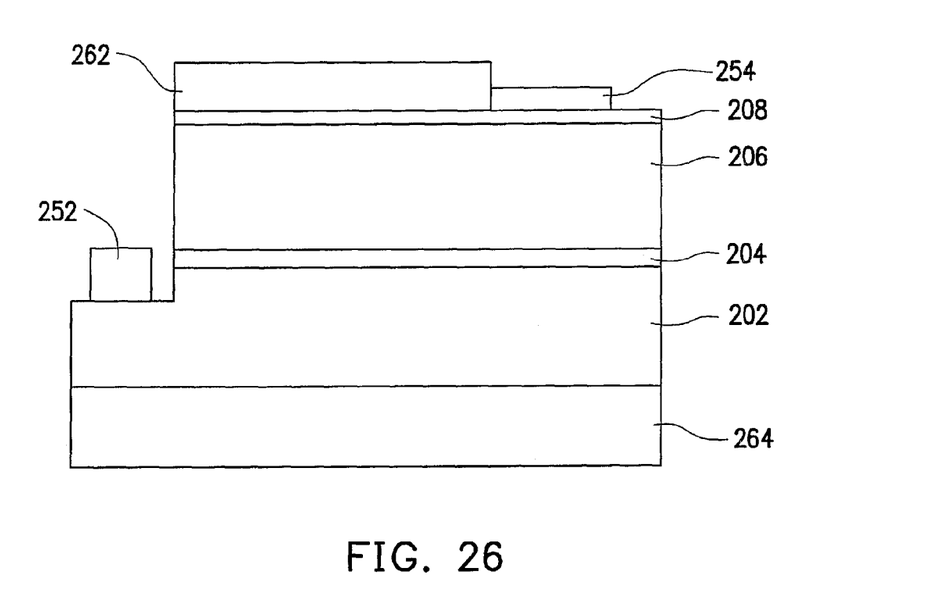
Figure 27:
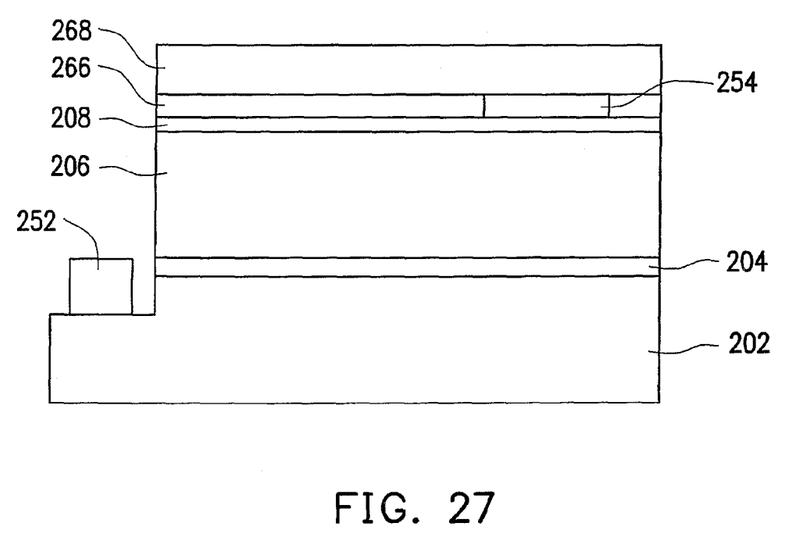

In FIG. 21, it is based on the structure in FIG. 11, the electrode 252 is disposed on the extending region of the doped semiconductor structural layer 202. Likewise, the electrode structures in FIGS. 22-27 are based on the structures in FIGS. 12-17 but the electrodes are disposed on the extending region of the doped semiconductor structural layer 202 while the magnetic-source layers are re-arranged.

In other words, the magnetic-source layer can be integrated into the LED as the light emitting device with magnetic field. The actual implementation can be down in various manners, as shown in the embodiments and the combination of embodiments to each other.

With respect to more various choices, for example, the light emitting surface can also be roughed to a certain level, so as to improve the light emitting quality. The ELOG technology, with respect to the structure in FIG. 6, can use the magnetic layer as the mask on the semiconductor substrate, then the processes of MOCVD (Metal Organic Chemical Vapor Deposition) or MBE(Molecular Beam Epitaxy) can be for example used to grow the semiconductor layer. As a result, the magnetic layer is embedded in the light emitting device.

Further, the materials for forming P-N junction optic-component can be in-organic or organic. For example, the in-organic semiconductor materials include GaAs, InP, GaN, GaP, AlP, AlAs, InAs, GaSb, InSb, Cds, CdSe, ZnS, ZnSe, . . . , and so on. The organic semiconductor materials include polymer or usually known organic material. The bonding methods can be, for example, die bonding, flip chip bonding, metal bonding, wafer bonding, . . . , and so on. The bonding material can be, for example, silver glue, goldtin, Au bump, mrat bump, . . . , and so on.

Further, the reflecting layer can be mirror, or dielectric reflecting layer , such as a distributed bragg reflector (DBR) structure, in which the dielectric material can include, for example, $TiO_2$, $TaO_5$, $SiO_2$, $Mb_2O_5$, $SeO_2$, ZnS, ZnO, or $MgF_2$. The substrate can include, for example, Si, Sic, GaN, GaP, GaAs, sapphire, Zno, or AlN. The soft magnetic material can include, for example, Fe, Co, Ni, Tb, Al, or the combination of them. The magnetic film can include Pt, Co, Sm, Fe, Ni, Cu, Cr, or Tb, by coating, for example.

Further, the magnetic materials can include, for example, ferromagnetic materials, such as Nd, Fe, Pg, Co, Ni, Mn, Cr, or Rb, or ceramic materials, such as MnOx, FeOx, CoO, CuO, VxOx, $Cr_2O_3$, CrS, MnS, MnSe, MnTe, MnFx, FeFx, CoFx, NiFx, VClx, CrClx, FeClx, CoClx, NiClx, CuClx, CuBrx, CrSb, MnAs, MnBi, Cr, α-Mn, $MnCl_2.4H_2O$, $MnBr_2.4H_2O$, $CuCl_2.2H_2O$, $Co(NH_4)x(SO_4)xCl_2.6H_2O$, $FeCo_3$, or $FeCo_3.2MgCO_3$.

It can be understood that the materials for the elements or the detail structure can be modified without deviating the features of the present invention.

It will be apparent to those skilled in the art that various modifications and variations can be made to the structure of the present invention without departing from the scope or spirit of the invention. In view of the foregoing descriptions, it is intended that the present invention covers modifications and variations of this invention if they fall within the scope of the following claims and their equivalents.

What is claimed is:

1. A light emitting device with magnetic field, comprising:
   a light-emitting structure, comprising a first doped structural layer, a second doped structural layer, an active layer between the two doped structural layers, a first electrode, and a second electrode; and
   a first magnetic-source layer, integrated with the light-emitting structure to produce a magnetic field in the light-emitting structure, wherein one of the first doped structural layer and the second doped structural layer being closer to the first magnetic-source layer is P doped.

2. The light emitting device of claim 1, wherein the magnetic field transversely shifts a driving current of the light-emitting structure to re-distribute in the light-emitting structure.

3. The light emitting device of claim 1, wherein the first magnetic-source layer is a transparent magnetic-source layer.

4. The light emitting device of claim 1, wherein the first magnetic-source layer comprises a magnetic film on the first doped structural layer.

5. The light emitting device of claim 1, wherein the light-emitting structure further comprises a mirror layer on the first doped structural layer; and the first magnetic-source layer includes a magnetic film on the mirror layer.

6. The light emitting device of claim 1, wherein the first magnetic-source layer is covering over the light-emitting structure at the portion other than the first electrode.

7. The light emitting device of claim 1, wherein the first doped structural layer comprises a transparent conductive layer in contact with the first electrode.

8. The light emitting device of claim 1, wherein the first magnetic-source layer is a magnetic film on a submount layer,
  wherein the first electrode and the second electrodes are located on a same side of the light-emitting structure, and the first electrode and the second electrode are packaged with the first magnetic-source layer.

9. The light emitting device of claim 8, wherein the first magnetic-source layer is packaged onto the first and second electrodes by bonding structures.

10. The light emitting device of claim 1, wherein the first electrode and the second electrode are located at two sides of the light-emitting structure, opposite to each other.

11. The light emitting device of claim 10, wherein the first magnetic-source layer is just disposed on a first one of the first electrode and the second electrode.

12. The light emitting device of claim 1, wherein the first magnetic-source layer is covering over the light-emitting structure, and the first electrode is covered as well.

13. The light emitting device of claim 12, further comprising a mirror layer between the first magnetic-source layer and the first doped structural layer.

14. A light emitting device with magnetic field, comprising:
  a light-emitting structure, comprising a first doped structural layer, a second doped structural layer, an active layer between the two doped structural layers, a first electrode, and a second electrode;
  a first magnetic-source layer, integrated with the light-emitting structure to produce a magnetic field in the light-emitting structure, wherein the first magnetic-source layer comprises:
    a submount layer; and
    a magnetic film on the submount layer, wherein the first electrode and the second electrode are located on a same side of the light-emitting structure; and
  a second magnetic-source layer, implemented over the light-emitting structure at an opposite side, so as to incorporate with the first magnetic-source layer to produce the magnetic field.

15. The light emitting device of claim 14, wherein the light-emitting structure includes a substrate or not includes a substrate to adapt the second magnetic-source layer.

16. A light emitting device with magnetic field, comprising:
  a light-emitting structure, comprising a first doped structural layer, a second doped structural layer, an active layer between the two doped structural layers, a first electrode, and a second electrode; and
  a first magnetic-source layer, integrated with the light-emitting structure to produce a magnetic field in the light-emitting structure, wherein the light-emitting structure is disposed on a substrate, and the first magnetic-source layer is also disposed on a portion of the substrate and between the substrate and the light-emitting structure.

17. A light emitting device with magnetic field, comprising:
  a light-emitting structure, comprising a first doped structural layer, a second doped structural layer, an active layer between the two doped structural layers, a first electrode, and a second electrode;
  a first magnetic-source layer, integrated with the light-emitting structure to produce a magnetic field in the light-emitting structure, wherein the first magnetic-source layer is just disposed on a first one of the first electrode and the second electrode; and
  a second magnetic-source layer just disposed on a second one of the first electrode and the second electrode.

18. The light emitting device of claim 17, wherein the first magnetic-source layer comprises at least one section distributed on the light-emitting structure, incorporating with the second magnetic-source layer to produce the magnetic field.

19. A light emitting device with magnetic field, comprising:
  a light-emitting structure, comprising a first doped structural layer, a second doped structural layer, an active layer between the two doped structural layers, a first electrode, and a second electrode;
  a first magnetic-source layer, integrated with the light-emitting structure to produce a magnetic field in the light-emitting structure, wherein the first magnetic-source layer is covering over the light-emitting structure, and the first electrode is covered as well; and
  a second magnetic-source layer disposed on the second electrode.

20. A light emitting device with magnetic field, comprising:
  a light-emitting structure, comprising a first doped structural layer, a second doped structural layer, an active layer between the two doped structural layers, a first electrode, and a second electrode;
  a first magnetic-source layer, integrated with the light-emitting structure to produce a magnetic field in the light-emitting structure, wherein the first magnetic-source layer is covering over the light-emitting structure at the portion other than the first electrode; and
  a second magnetic-source layer disposed on the second electrode.

21. A light emitting device with magnetic field, comprising:
  a light-emitting structure, comprising a P doped structural layer, an N doped structural layer, and an active layer between the two doped structural layers;
  a transparent magnetic-source layer, disposed on the P doped structural layer;
  a first electrode, disposed on the transparent magnetic-source layer; and
  a second electrode, disposed on the N doped structural layer, at an opposite side to the first electrode.

22. The light emitting device of claim 21, wherein the magnetic field transversely shifts a driving current of the light-emitting structure to re-distribute in the light-emitting structure.

23. A light emitting device with magnetic field, comprising:
  a light-emitting structure, comprising a first doped structural layer, a second doped structural layer, and an active layer between the two doped structural layers;
  a transparent magnetic-source layer, disposed on the first doped structural layer;
  a first electrode, disposed on the transparent magnetic-source layer;

a second electrode, disposed on the second doped structural layer, at an opposite side to the first electrode; and a magnetic-source layer disposed on the second electrode.

24. A light emitting device with magnetic field, comprising:

a light-emitting structure, comprising a P doped structural layer, an N doped structural layer, and an active layer between the two doped structural layers;

a transparent magnetic-source layer, disposed on the P doped structural layer;

a first electrode, disposed on the transparent magnetic-source layer; and a second electrode, disposed on the N doped structural layer, wherein the first electrode and the second electrode are located on a same side of the light-emitting structure.

* * * * *